United States Patent [19]

Otsubo

[11] Patent Number: 5,017,243
[45] Date of Patent: May 21, 1991

[54] SOLAR CELL AND A PRODUCTION METHOD THEREFOR

[75] Inventor: Mutsuyuki Otsubo, Itami, Japan

[73] Assignee: Mitsubishi Denki Kabushiki Kaisha, Japan

[21] Appl. No.: 434,984

[22] Filed: Nov. 13, 1989

[30] Foreign Application Priority Data

Jan. 6, 1989 [JP] Japan ................... 1-1510

[51] Int. Cl.⁵ ............... H01L 31/05; H01L 31/18
[52] U.S. Cl. ............................. 136/244; 136/256; 437/2
[58] Field of Search ............ 136/244, 256, 249 MS; 437/2-5

[56] References Cited

U.S. PATENT DOCUMENTS

| | | | |
|---|---|---|---|
| 3,278,811 | 10/1966 | Mori | 357/29 |
| 3,450,568 | 6/1969 | Mann | 136/244 |
| 3,527,619 | 9/1970 | Miley | 136/244 |
| 4,610,077 | 9/1986 | Minahan et al. | 437/2 |
| 4,838,952 | 6/1989 | Dill et al. | 136/256 |
| 4,854,975 | 8/1989 | Krause | 136/262 |

FOREIGN PATENT DOCUMENTS

| | | | |
|---|---|---|---|
| 2624926 | 12/1977 | Fed. Rep. of Germany | 136/249 MS |
| 3234925 | 4/1983 | Fed. Rep. of Germany | 136/249 MS |
| 53-53284 | 5/1978 | Japan | 136/249 MS |
| 58-193646 | 12/1983 | Japan | 136/251 |
| 62-113483 | 5/1987 | Japan | 136/244 |
| 1351454 | 5/1974 | United Kingdom | 136/249 MS |

OTHER PUBLICATIONS

Ho et al, "Thin Foil Silicon . . . Back Contacts", IEEE photovoltaic Specialists Conf. (1981), pp. 102–106.
Matsunami, "Progress in . . . Photovoltaics", Int'l PVSEC-1, pp. 133–138.
Takahashi et al, "Solar Cell Generation", Shuppan, pp. 147, 322, and 323.
Kukulka et al, "Large Area . . . Solar Cells", IEEE Photovoltaic Specialists Conf. (1982), pp. 146–149.
Mardesich et al, "Mechanical Wraparound . . . Space Arrays", IEEE Photovoltaic Specialists Conf. (1982), pp. 160–163.

Primary Examiner—Aaron Weisstuch
Attorney, Agent, or Firm—Leydig, Voit & Mayer

[57] ABSTRACT

A solar cell includes a first conductivity type semiconductor substrate, a second conductivity type semiconductor layer disposed at a first surface of the semiconductor substrate, a first electrode disposed on the semiconductor layer, a second electrode disposed on the first semiconductor substrate opposite the layer, a connection electrode disposed on the first surface f the semiconductor substrate insulated from the semiconductor layer, and an electrically conducting layer electrically connecting the second electrode and the connection electrode extending in the direction of the thickness of the semiconductor substrate. Since the first electrode and the connection electrode of the solar cell are both disposed on the first surface of the semiconductor substrate, the interconnection of a pair of adjacent solar cells is greatly simplified.

8 Claims, 11 Drawing Sheets

SOLAR CELL AND A PRODUCTION METHOD THEREFOR

FIELD OF THE INVENTION

The present invention relates to a solar cell and a production method therefor and, more particularly, to solar cells for easy and precise serial connection.

BACKGROUND OF THE INVENTION

Figure 14:
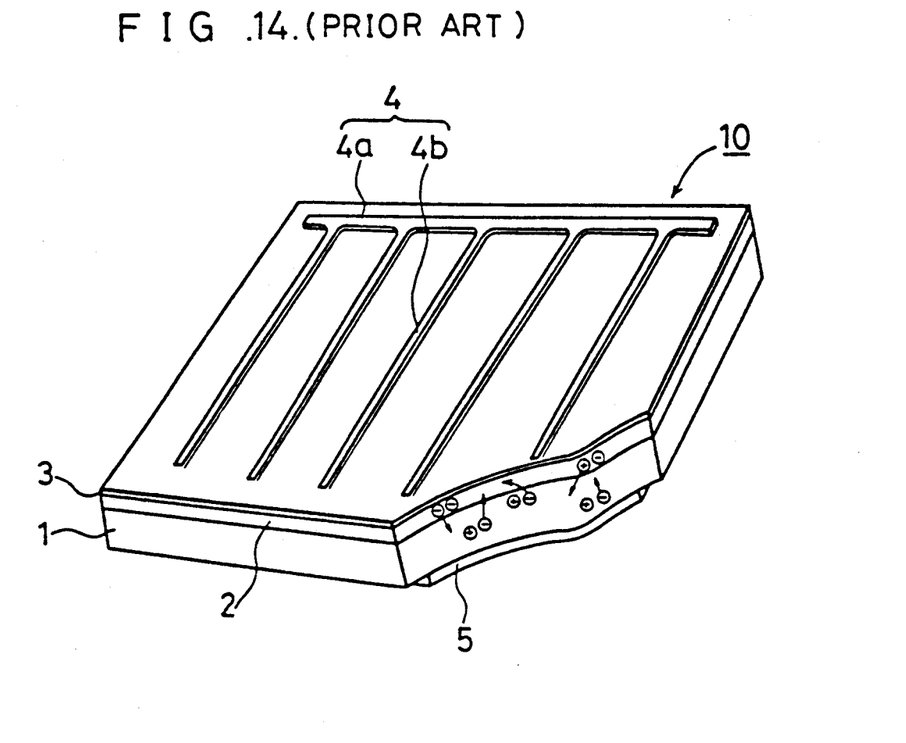

FIG. 14 shows a prior art solar cell which is disclosed in "Solar Photovoltaic Power Generation" by Kiyoshi Takahashi, Yoshihiro Hamakawa, and Akio Ushirokawa, *Morikita Shuppan*, 1980, pages 147, 322, and 323. As shown in the figure, an n+ layer 2 is disposed at a first surface of a p-type silicon substrate 1, and a collection electrode 4 is disposed on the n+ layer 2. The collection electrode 4 includes an external connection bus electrode 4a and comb-type bar electrodes 4b and functions as a negative electrode. Where the collection electrode 4 on the n+ layer 2 is absent, a reflection preventing film 3 is disposed. A plane electrode 5, which functions as a plus side electrode, is disposed on the other surface of the p-type silicon substrate 1.

Figure 15:
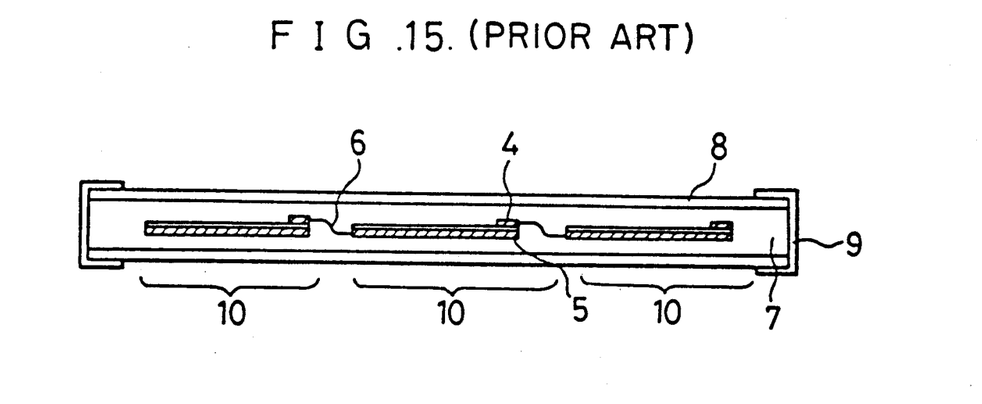
FIG. 15 is a cross-sectional view showing a prior art solar cell module.

FIG. 15 shows a solar cell module in which the solar cells 10 as described above are connected serially and in parallel to generate higher power. As shown in the figure, the collection electrode 4 (bus electrode 4a) of one of the two adjacent solar cells 10 is connected with the planar electrode 5 of the other of the cells 10 via a metal foil 6 several tens of microns thick.

A silver foil is usually used as the metal foil 6 and is bent at two location as shown in FIG. 15. One end of the metal foil 6 is welded or soldered to the bus electrode 4a of the collection electrode 4 of the respective solar cells 10. Next, the solar cells 10, having the metal foil 6 connected with the bus electrodes 4a, are arranged upside-down. Thereafter, the free end of each of the metal foils 6 is welded or soldered to the planar electrodes 5 of the adjacent solar cells.

The solar cells 10 connected in series by metal foils 6 are encapsulated in a transparent water-proof resin 7 and the transparent water-proof resin 7 is disposed between glass plates 8. Finally, in an environment where the intrusion of air is prevented, the device is heated above the softening point of the resin so that the solar cells 10, the transparent water-proof resin 7, and the glass plates 8 are adhered. Then, edges of the adhered device are mounted in a metal frame 9, thereby completing a solar cell module.

In such a prior art solar cell, the collection electrode 4 at the surface of one of the adjacent solar cells and the plane electrode 5 at the rear surface of the other of the adjacent solar cells have to be connected by the metal foil 6. The connection process using the metal foil 6 is troublesome because the foil has to be connected at both the front and rear surfaces of the solar cells. Since the collection electrode 4 projects from the front surface, when the metal foil 6 is bonded onto the planar electrode 5 (the respective solar cells are then upside-down), the respective solar cells 20 are unstable. The solar cells are then supported only by the collection electrode 4, thereby making it impossible to apply sufficient force for bonding the metal foil 6 onto the planar electrodes 5.

SUMMARY OF THE INVENTION

An object of the present invention is to provide a solar cell and a production method therefor for easy and precise serial connection of solar cells.

Other objects and advantages of the present invention will become apparent from the detailed description given hereinafter. It should be understood, however, that the detailed description and specific embodiments are given by way of illustration only, since various changes and modifications within the spirit and scope of the invention will become apparent from the detailed description.

According to an aspect of the present invention, a solar cell includes a first conductivity type semiconductor substrate, a second conductivity type semiconductor layer disposed at a first surface of the semiconductor substrate, a first electrode disposed on the semiconductor layer, a second electrode disposed on a second surface of the semiconductor substrate, a connection electrode disposed on the first surface of the semiconductor substrate insulated from the semiconductor layer, and an electrical conductor electrically connecting the second electrode and the connection electrode along the thickness direction of the semiconductor substrate.

According to another aspect of the present invention, a fabrication method of a solar cell includes preparing a first conductivity type semiconductor substrate, producing a second conductivity type semiconductor layer on a first surface of the semiconductor substrate, depositing a first electrode on the semiconductor layer, producing an electrically conductive layer in the thickness direction of the semiconductor substrate, depositing a connection electrode electrically connected with the conductive layer and insulated from the semiconductor layer on the first surface of the semiconductor substrate at a position isolated from the semiconductor layer, and depositing a second electrode electrically connected with the conductive layer at a second surface of the semiconductor substrate.

In the present invention, since the first electrode and the connection electrode of the solar cell are both disposed on the first surface of the semiconductor substrate, the connection between the first electrode and the connection electrode of the different solar cells can be completed at one surface of each of the cells.

BRIEF DESCRIPTION OF THE DRAWINGS

14 is a perspective view showing a prior art solar cell; and

DETAILED DESCRIPTION OF THE PREFERRED EMBODIMENTS

Figure 1:
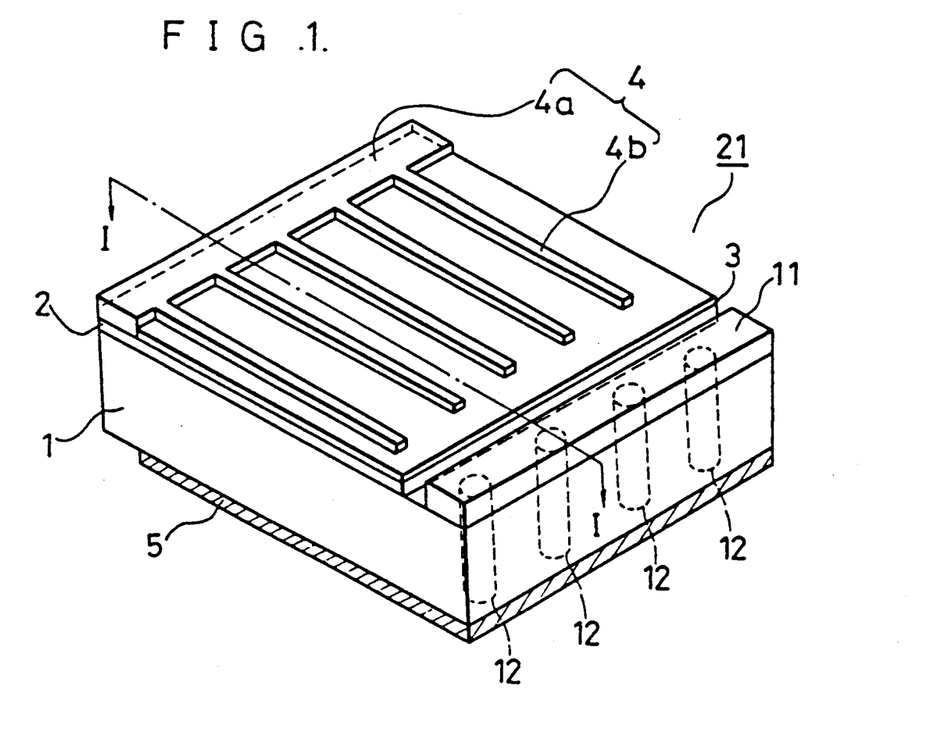
FIG. 1 is a perspective view showing a solar cell according to a first embodiment of the present invention.
Figure 2:
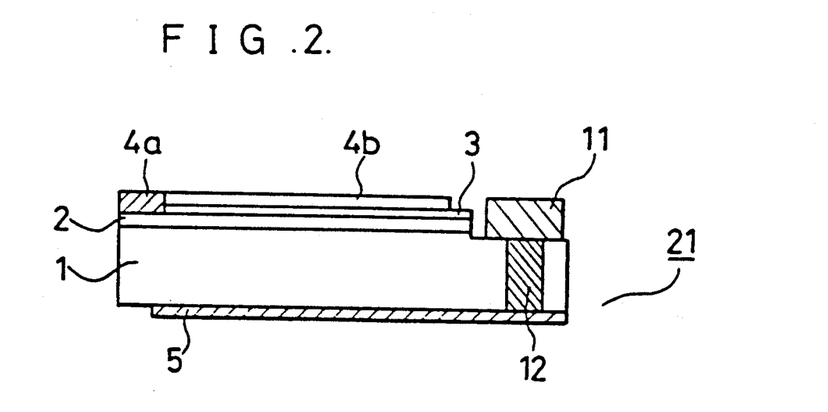
FIG. 2 is a cross-sectional view taken along line I—I of the solar cell shown in FIG. 1.

FIG. 1 shows a solar cell according to a first embodiment of the present invention and FIG. 2 shows a cross-sectional view taken along line I—I of FIG. 1.

As shown in FIGS. 1 and 2, a connection electrode 11 is disposed at a location on the surface of the p-type silicon substrate 1 where the n+ layer 2 is absent and is separated from n+ layer 2. The connection electrode 11 is electrically connected with the planar electrode 5 disposed on the rear surface of the p-type silicon substrate 1 via an electrically conducting penetrating via 12. The via 12 comprises a hole metallized on its surface or throughout its volume. The same elements of FIG. 1 already described for the prior art device are not described again.

FIGS. 3(a) to 3(g) show a method for producing the solar cell 21 according to the first embodiment.

Figures 3A, 3B:
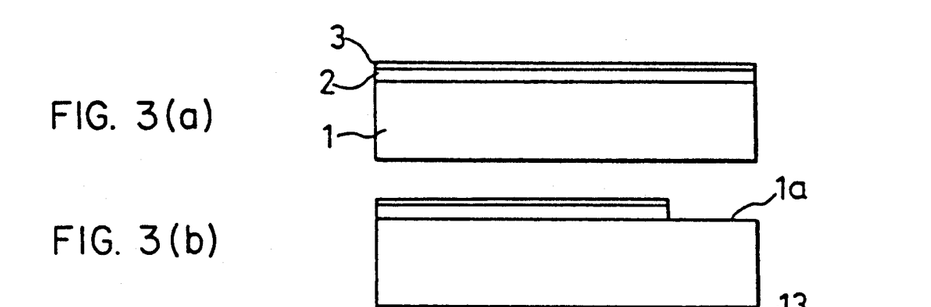
FIGS. 3(a) to 3(g) are cross-sectional views illustrating a fabrication method for a solar cell according to the first embodiment.

As shown in FIG. 3(a), an n+ layer 2 is formed in the p-type silicon substrate 1 and a reflection preventing film 3 is formed on the n+ layer 2. Next, as shown in FIG. 3(b), portions of the n+ layer 2 and the reflection preventing film 3 are removed by etching, and a portion 1a of the surface of the p-type silicon substrate 1 is exposed.

Figure 3C:
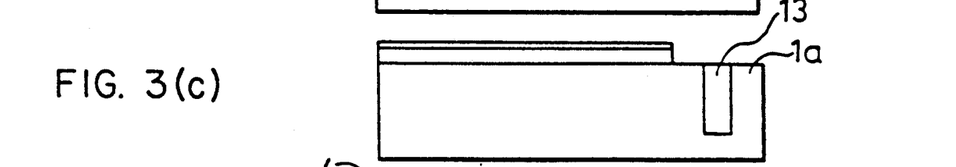
Figure 3D:
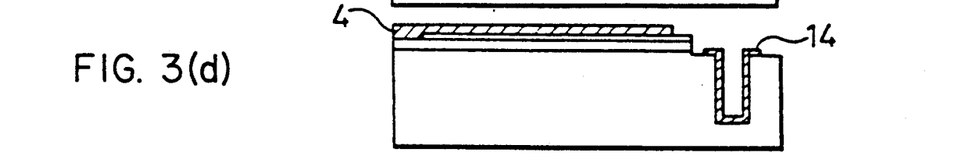

An aperture 13 having a depth corresponding to a desired substrate thickness, that is, the substrate thickness which is to remain, is produced as shown in FIG. 3(c). Thereafter, a region of the reflection preventing film 3 distant from aperture 13 is removed, for example, by etching. This region where the film is removed is used for forming an electrode. A collection electrode 4 is deposited on the electrode production region of the n+ layer 2 and on parts of the reflection preventing film 3. Further, a metallic grounding layer 14 is deposited by sputtering or vapor deposition on the bottom surface and side surfaces of the aperture 13 of the exposed portion 1a, as shown in FIG. 3(d).

Figure 3E:
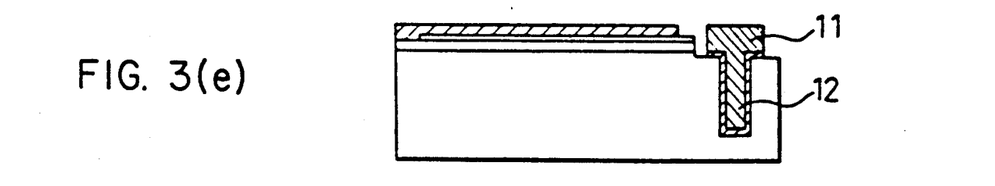

The entire aperture 13 is filled with metal, thereby producing a via 12, as shown in FIG. 3(e), including a connection electrode 11 on the exposed portion 1a communicating with the via 12. Herein, sputtering or vapor deposition may be used for production of the connection electrode 11.

Figure 3F:
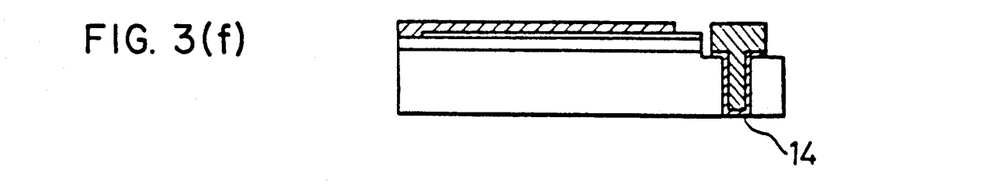
Figure 3G:
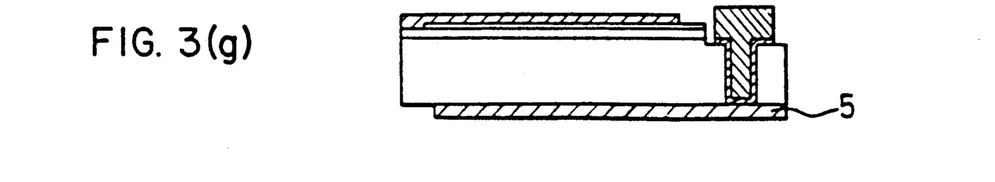

The p-type silicon substrate is polished from the rear surface, for example, by etching, and, as shown in FIG. 3(f), the grounding layer 14 is exposed from the rear surface of the p-type silicon substrate 1. Finally, a plane electrode 5 electrically connected with the grounding layer 14 at the rear surface of the p-type silicon substrate 1 is deposited, thereby completing a solar cell 21.

Figure 4:
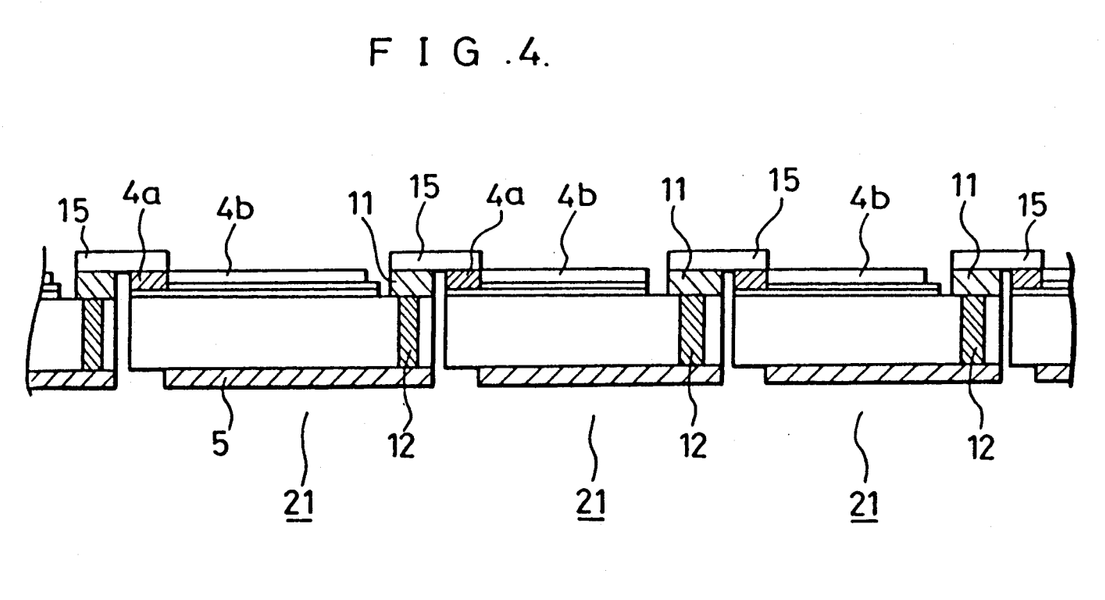
FIG. 4 is a diagram showing the manner of connection of solar cells according to the first embodiment.

FIG. 4 shows the manner of serial connection of the solar cell 21 of the first embodiment. In FIG. 4, reference numeral 15 designates a mutual connection piece comprising a metal ribbon or solder.

As shown in FIG. 4, a mutual connection piece 15 is arranged over the bus electrode 4a of one of two adjacent solar cells 21 and extends to the connection electrode 11 of the other of the adjacent solar cells. The mutual connection pieces 15 are welded or soldered to those electrodes. The connection electrode 11 produced at one surface of the cell is electrically connected to the planar electrodes 5 through the via 12 so that the serial connection of the adjacent solar cells by the mutual connection pieces 15 is accomplished solely at the surface of the p-type silicon substrate 1. Therefore, the solar cells 21 can be serially connected stably with the planar electrode 5 positioned at the bottom side.

As a result, the connection process is significantly simplified. Furthermore, since the unstable connection process where the solar cells 21 are upside-down and only supported by collection electrodes 4 is avoided, there are no problems of peeling or cracking at the connections, thereby enhancing reliability. Since the end portions of the plane electrodes 5 at the side opposite the connection electrode 11 are removed, the planar electrodes 5 of the adjacent solar cells are not short-oirouited by the serial connection process.

Figure 5:
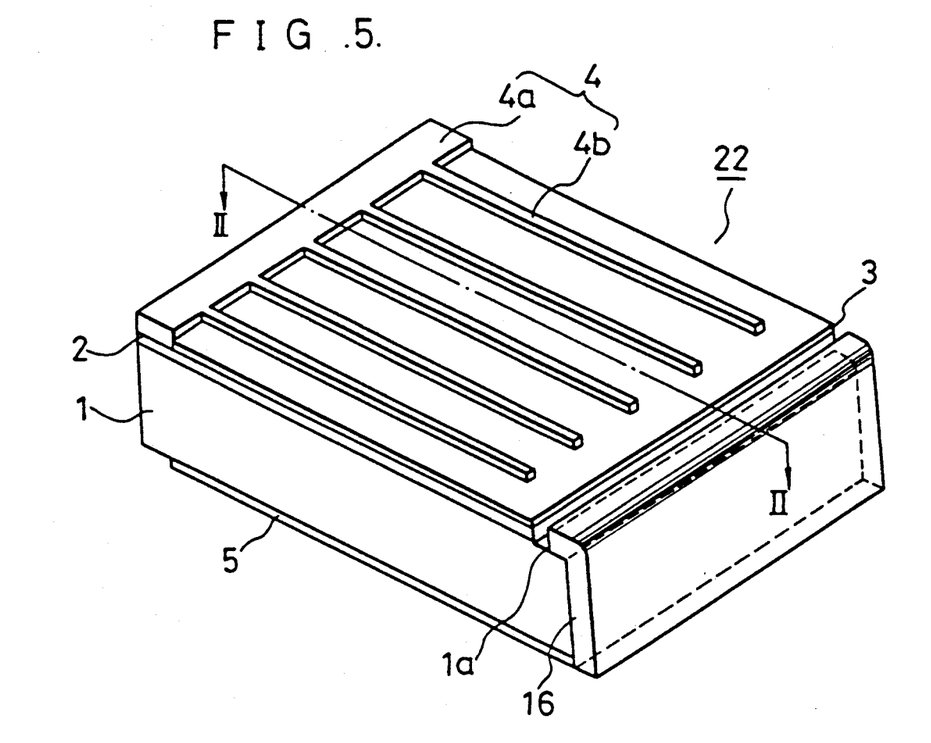
FIG. 5 is a perspective view showing a solar cell according to a second embodiment of the present invention.
Figure 6:
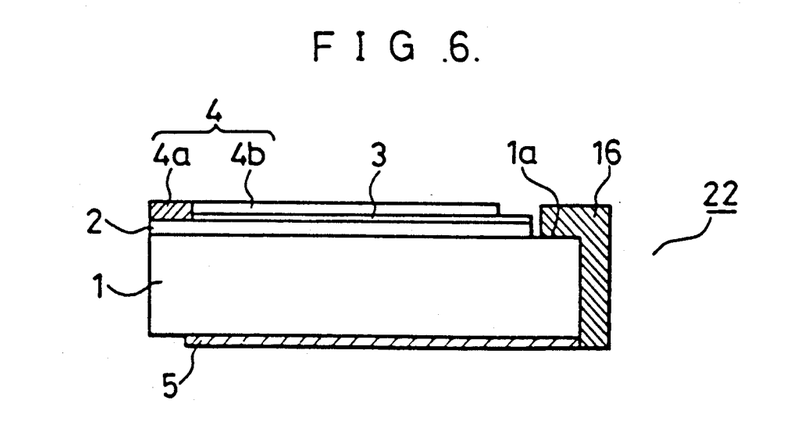
FIG. 6 is a cross-sectional view taken along line II—II of the solar cell shown in FIG. 5.

FIG. 5 shows a solar cell 22 according to a second embodiment of the present invention. FIG. 6 shows a crosssection taken along line II—II of FIG. 5. As shown in FIGS. 5 and 6, a connection electrode 16 is disposed over a side surface at one side of the p-type silicon substrate 1 to the exposed portion 1a. This connection electrode 16 is electrically connected to the planar electrode 5 and is produced independently from the n+ layer 2. The portion of the connection electrode 16 on the side surface of the p-type silicon substrate 1 electrically connects the connection electrode 16 on the exposed portion 1a of the p-type silicon substrate 1 with the planar electrode 5 as the via 12 of the first embodiment did.

Figure 13:
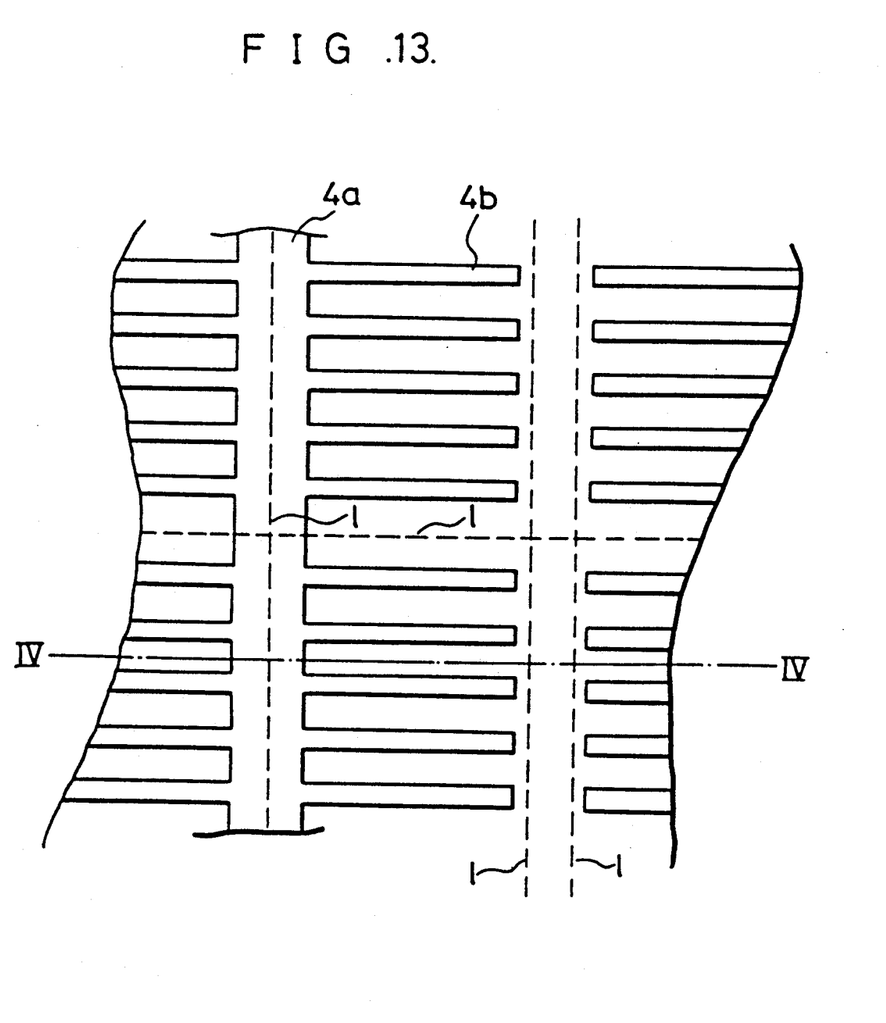
FIG. 13 is a top view showing a fabrication method of a solar cell according to the second embodiment.

FIGS. 7(a) to 7(g) show cross-sectional views illustrating a fabrication method of a second embodiment in which a plurality of solar cells are produced at the same time. FIG. 13 shows a top view of the process and, for simplicity of explanation, only the collection electrode 4 (4a, 4b) and the cutting line 1 are shown.

Figure 7A:
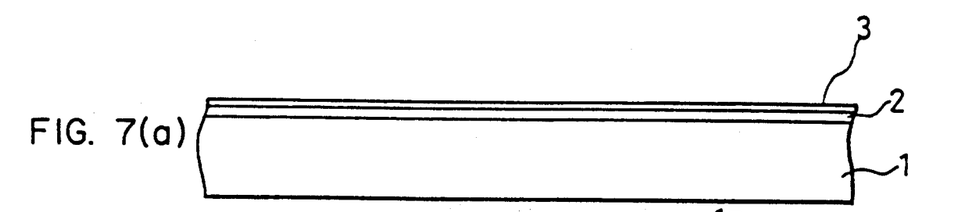
FIGS. 7(a) to 7(g) are cross-sectional views illustrating a fabrication method for a solar cell according to the second embodiment.
Figure 7B:
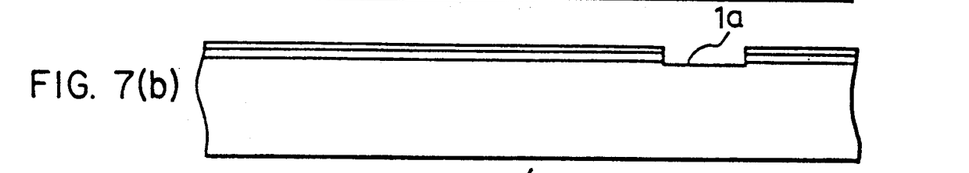
Figure 7C:
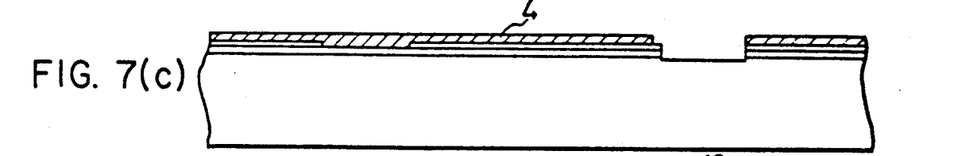

As shown in FIG. 7(a), an n+ layer 2 is formed at the surface of a p-type silicon substrate 1 and a reflection preventing film 3 is deposited on the n+ layer 2. Next, portions of the n+ layer 2 and the reflection preventing film 3 are removed by etching to expose a portion 1a of the surface of the p-type silicon substrate 1, as shown in FIG. 7(b). Thereafter, a region of the reflection preventing film 3 is removed, for example, by etching, thereby producing an electrode production region distant from portion 1a. A collection electrode 4 is deposited on the electrode production region of the n+ layer 2 and on parts of the reflection preventing film 3, as shown in FIG. 7(c). FIG. 7(c) corresponds to the crosssection taken along line IV—IV of FIG. 13.

Figure 7D:
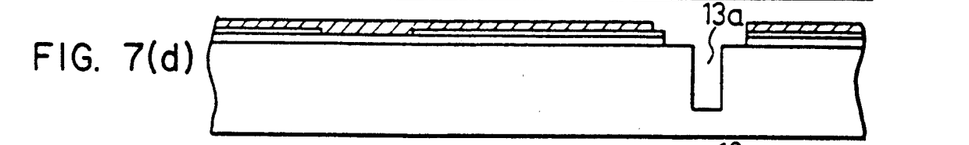
Figure 7E:
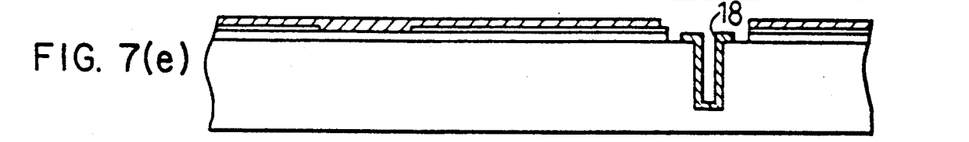
Figure 7F:
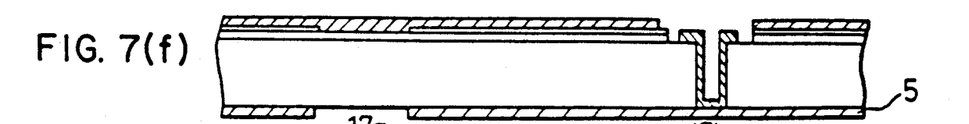

Subsequently, a groove 13a of a depth corresponding to a desired substrate thickness is produced by etching from the exposed portion 1a of the p-type silicon substrate 1, as shown in FIG. 7(d). A metallic grounding layer is deposited by sputtering or vapor deposition covering the bottom surface and the side surface of the groove 13a up to the exposed portion 1a. Thereafter, an electrically conducting layer 18 is deposited, as shown in FIG. 7(e). The conducting layer 18 itself may be produced by vapor deposition or sputtering.

Figure 7G:
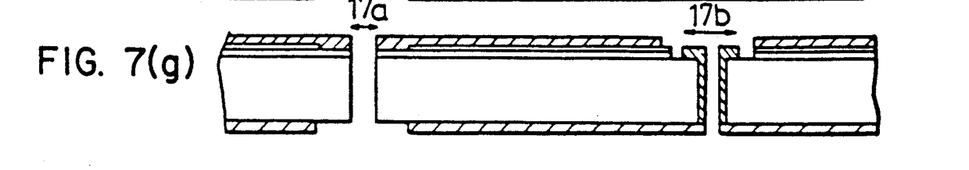

Thereafter, a p-type silicon substrate 1 is polished from the rear surface by, for example, etching, thereby exposing the conducting layer 18 from the rear surface of the p-type silicon substrate 1 and, as shown in FIG. 3(f), a planar electrode 5 is produced at the rear surface of the p-type silicon substrate 1 electrically connected with the conducting layer 18. Herein, because the collection electrode 4 is deposited on a film, the p-type silicon substrate 1 is not deflected by the polishing. Finally, as shown in FIG. 7(g), the substrate is broken at portions 17a and 17b (refer to cutting lines of FIG. 13), and solar cells 22 having a connection electrode 16 derived from the conducting layer 18 are produced.

Figure 8:
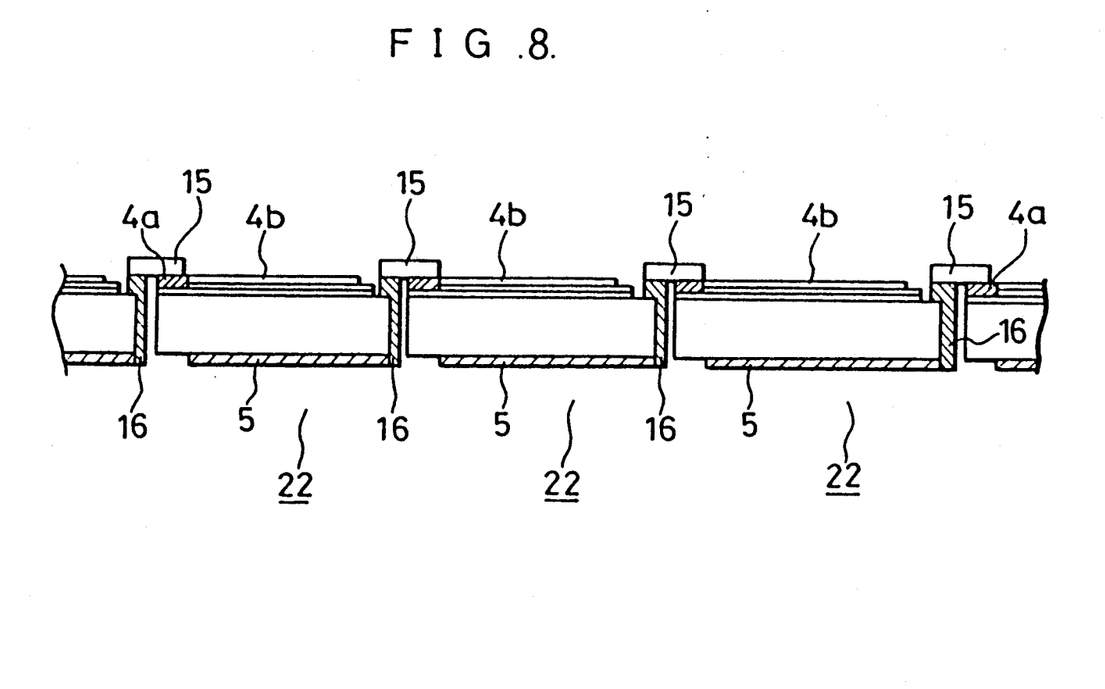
FIG. 8 is a diagram showing the manner of connection of solar cells according to the second embodiment.

FIG. 8 is a diagram explaining the manner of connection of the solar cells 22. As shown in FIG. 8, because the connection electrode 16, which is electrically connected to the planar electrode 5, is produced extending up to the front surface, serial connection between the different solar cells using the mutual connection pieces 15 can be completed using only the top surface of the p-type silicon substrate 1, and the solar cells can be installed stably with the planar electrodes 5 at the bottom side.

As a result, similar to the solar cell of the first embodiment, the connection process is simplified and the reliability of the connections is enhanced, Similar to the first embodiment, since the ends of the planar electrode 5 at the side opposite the connection electrode 11 are removed, the planar electrodes 5 of adjacent solar cells will not short-circuit.

Figure 9:
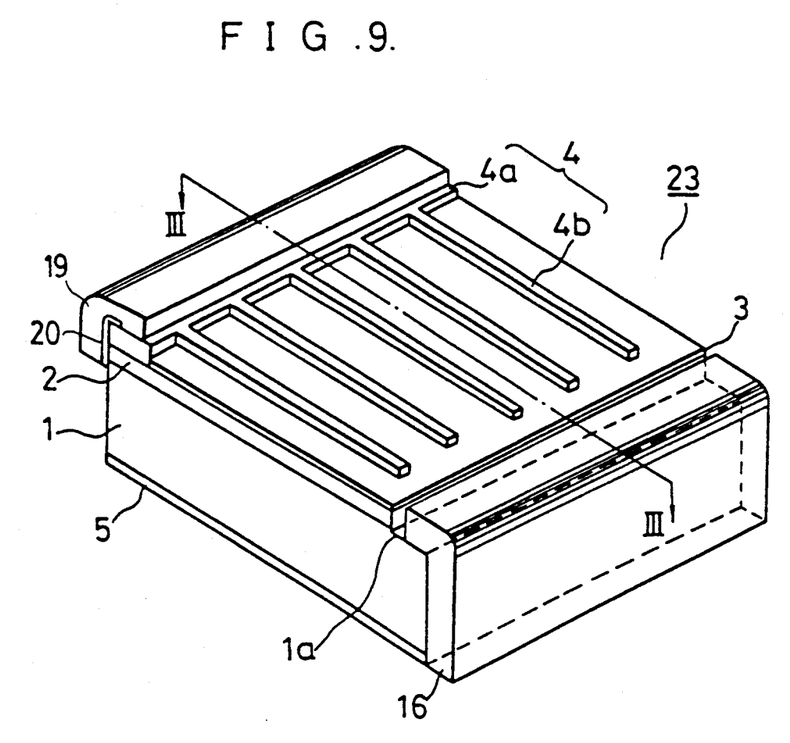
FIG. 9 is a perspective view showing a solar cell according to a third embodiment of the present invention.
Figure 10:
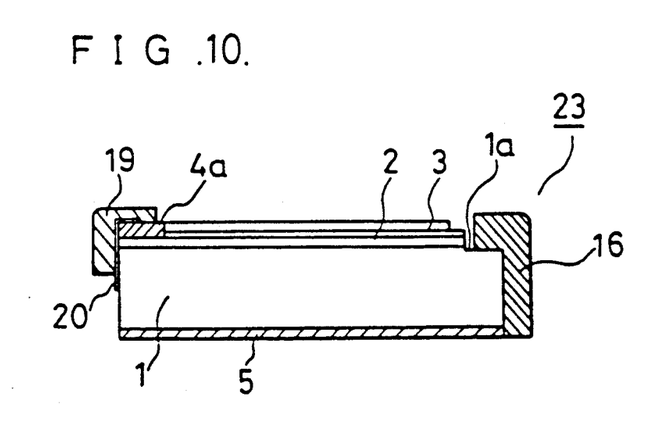
FIG. 10 is a cross-sectional view taken along line III—III of the solar cell shown in FIG. 6.

FIG. 9 shows a perspective view of a solar cell 23, a third embodiment of the present invention, and FIG. 10 is a cross-sectional view taken along line III—III of FIG. 9.

As shown in FIGS. 9 and 10, in addition to the construction of the solar cell 22 according to the second embodiment, a solder electrode 19 is disposed over a side surface of the p-type silicon substrate 1 at the side opposite the connection electrode 16 to a portion of the bus electrode 4a. This solder electrode 19 is electrically connected with the bus electrode 4a, and it is insulated from the p-type silicon substrate 1, the n+ layer 2, and the reflection preventing film by an insulating film 20.

FIGS. 11(a) to 11(h) show cross-sectional views for explaining a production method of a solar cell device according to a third embodiment of the present invention in which a plurality of solar cells 22 are connected with each other similarly as in the second embodiment.

Figure 11A:
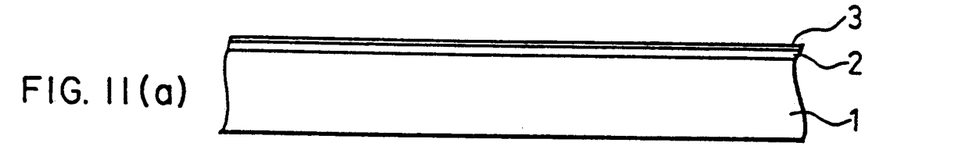
FIGS. 11(a) to 11(h) are cross-sectional views illustrating a fabrication method for a solar cell according to the third embodiment.
Figure 11B:
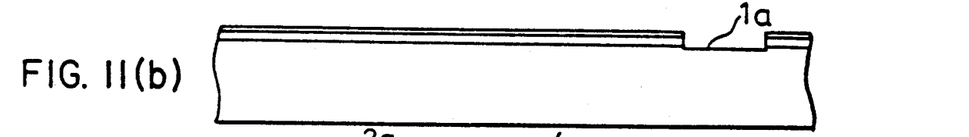
Figure 11C:
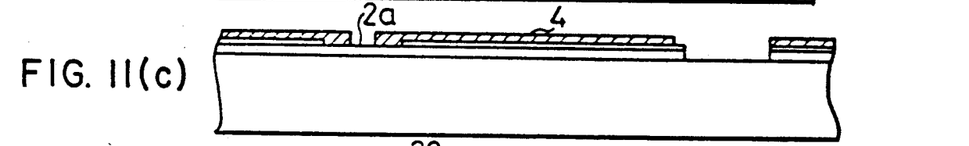

As shown in FIG. 11(a), an n+ layer 2 is formed at the surface of a silicon substrate 1 and a reflection preventing film 3 is deposited on the n+ layer 2. Next, portions of the n+ layer 2 and the reflection preventing film 3 are removed by etching, thereby exposing a portion 1a of the surface of the p-type silicon substrate 1, as shown in FIG. 11(b). Thereafter, a predetermined region of the reflection preventing film 3 is removed, for example, by etching, thereby producing an electrode production region except at a region 1a. A collection electrode 4 is formed at this electrode production region of the n+ layer 2, as shown in FIG. 11(c).

Figure 11D:
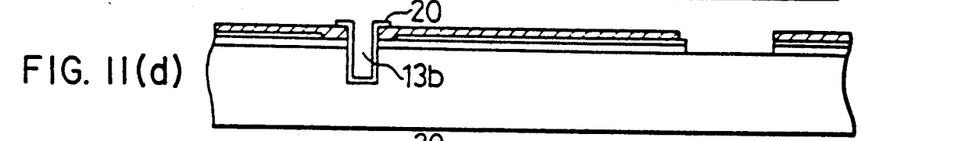
Figure 11E:
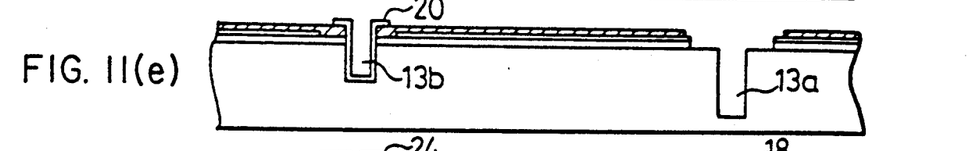

Next, a groove 13b is produced at an exposed portion 2a and, as shown in FIG. 11(d), an insulating film 20 is deposited over the bottom surface and on the side surfaces of the cutting groove 13b and on a portion of the collection electrode 4. Thereafter, a groove 13a is produced at the exposed region 1a, as shown in FIG. 11(e).

Figure 11F:
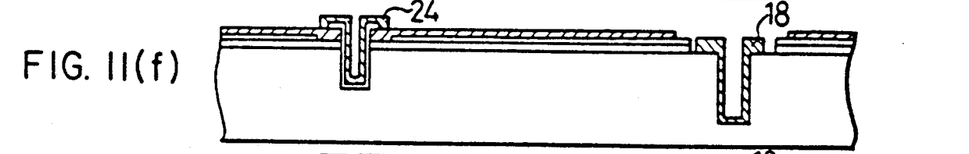

As shown in FIG. 11(f), a metallic grounding layer 18 is produced by sputtering or vapor deposition over the bottom surface and side surfaces of the groove 13a on a portion of the exposed region 1a An electrically conducting layer 24 is similarly deposited on a portion of insulating film 20 and the collection electrode 4. The conducting layers 18 and 24 themselves may be produced by vapor deposition or sputtering.

Figure 11G:
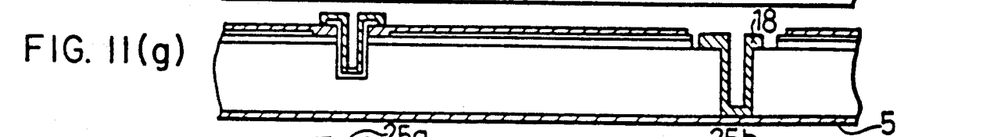
Figure 11H:
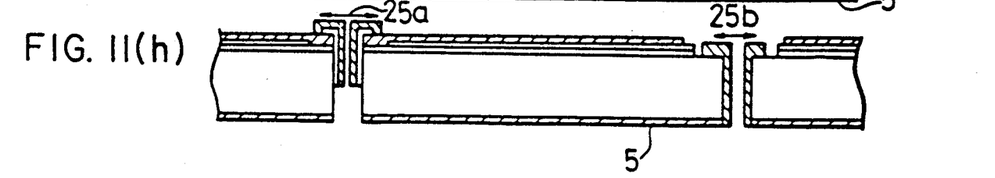

Thereafter, the rear surface of the p-type silicon substrate 1 is polished, for example, by etching, thereby exposing the conducting layer 18 at the rear surface. As shown in FIG. 11(g), a planar electrode 5 is produced at the rear surface of the p-type silicon substrate 1 electrically connected with the conducting layer 18. Finally, as shown in FIG. 11(h), the substrate is broken at portions 25a and 25b, thereby producing solar cells 23 having connection electrodes 16 produced from the layer 18 and the solder electrodes 19 produced from the layer 24.

Figure 12:
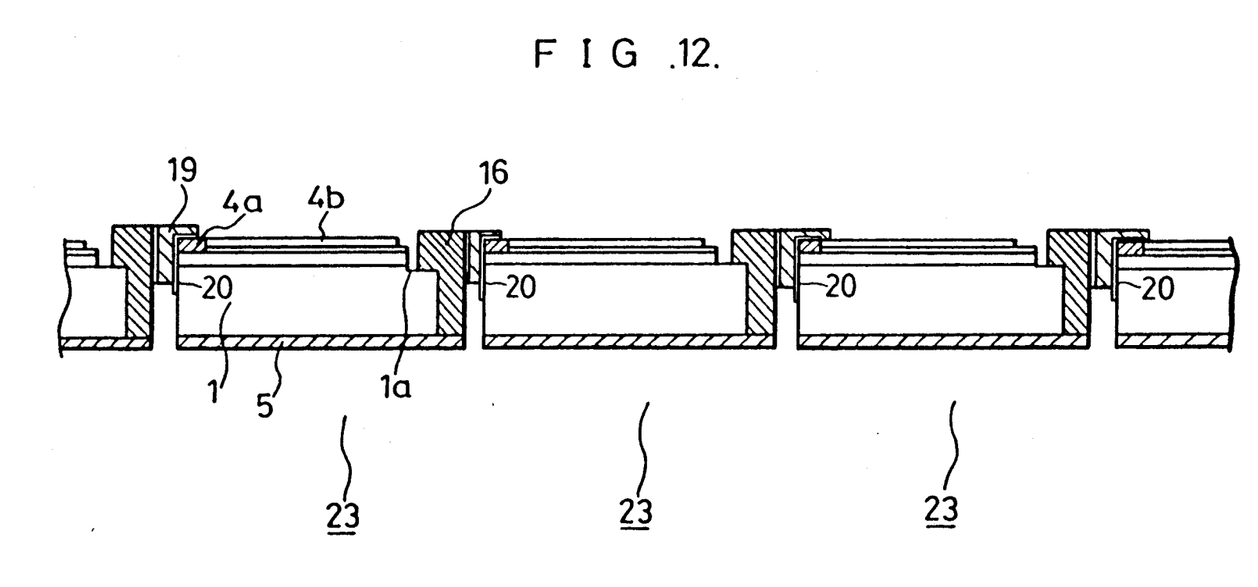
FIG. 12 is a diagram showing the manner of connection of solar cells according to the third embodiment.

FIG. 12 shows the manner of connection of solar cells 23. As shown in FIG. 12, solar cells are arranged adjacent to and contacting each other and heated to a temperature above the melting point of the solder, to about 140 to 150° C. The solder electrode 19 and the connection electrode 16 are connected by soldering without requiring the mutual connection pieces 15 as in solar cells 21 and 22.

Because electrode connections are made without using mutual connection pieces 15, the production process of the solar cell module is simpler than that for the solar cells 21 and 22. Further, since the electrode connections are made only by heating, the mechanical stresses applied to the solar cells 23 during the connection of electrodes are almost eliminated and solar cells having much higher reliability are obtained. The same effects can also be obtained by using mutual connection pieces 15 made of solder by arranging the mutual connection pieces on the bus electrode 4a and the connection electrode 11 or 16, and by making electrode connections by heating the device above the melting point of the solder even in the solar cells 21 and 22. In the solar cells 23, it is possible to maintain the insulating distance between the planar electrodes 5 of the adjacent solar cells through the thickness of the solder electrode 19. Therefore, it is not necessary to remove a portion of the planar electrode 5 as in the solar cells of the first and second embodiments.

In the above-described embodiments, a rectangular solar cell is described, but the configuration of the solar cell is not restricted to a rectangular shape.

In the second and third embodiments, solar cell production methods for producing several solar cells at the same time are described but, as in the first embodiment, the solar cells may be individually produced.

As is evident from the foregoing description, according to the present invention, since the first electrode and the connection electrode are both produced on a first surface of a semiconductor substrate, the connection between the first electrode and the connection electrode of adjacent solar cells can be carried out on a single surface of each cell. As a result, a solar cell device in which serial connection of solar cells can be completed easily and precisely is easily obtained.

What is claimed is:

1. A solar cell comprising:

a first conductivity type semiconductor substrate body having opposed first and second major surfaces;

a second conductivity type semiconductor layer disposed on a part of the first major surface of siad semiconductor substrate for receiving incident light and forming a pn junction with said substrate for generating a photovoltage in response to incident light;

a first electrode disposed on siad semiconductor layer;

a second electrode dipsosed on the second major surface of said semiconductor substrate;

a connection electrode disposed on a part of the first major surface of siad semiconductor substrate where siad semiconductor conductor layer is absent and electrically insulated from said semiconductor layer; and an electrical conductor electically connecting siad second electrode and siad connection electrode extending through said semiconductor substrate from the first major surface to the second major surface.

2. A solar cell as defined in claim 1 wherein said first electrode comprises a bus portion and a plurality of comb electrode portions extending from the bus portion.

3. A solar cell device including a plurality of solar cells as defined in claim 1 and a plurliaty of cell interconnectors wherein adjacent cells are serrially connected by respective interconnectors disposed on said first electrode of one cell and said connection electrode at the first major surface of an adjacent cell.

4. A solar cell comprising:
a first conductivity type semiconductor substrate having opposed first and second major surfaces and opposed first and second side surfaces adjoining the first and second major surfaces;

a second conductivity type semiconductor layer idsposed on a part of the first major surface of siad semiconductor substrate for receiving incident light and forming a pn junction with said substrate for generating a photovoltage in response to said incident light;

a fisrt electrode disposed on siad semiconductor layer;

a second electrode disposed on the second major surface of siad semiconductor substrate;

a connection electrode disposed on part of the first major surface of siad semiconductor substrate where siad semiconductor layer is absent and electrically insulated form siad semiconductor layer, extending along the first side surface of said semiconducto substrate, and connected to said second electrode; adn a solder electrode disposed on said first electrode, extending along the second side surface of said semiconductor substrate and an electrically insulating film disposed on siad second side surface insulating siad solder electrode from said substrate.

5. A solar cell device including a plurality of solar cells as defined in claim 4, adjacent cells being serially electrically interconnected by direct soldering of a connection electrode of one cell to a solder electrode of an adjacnet cell.

6. A production method for a solar cell comprsiing:
preparing a first ocnductivyt type semiconductor substrate having opposed first and second major surfaces;

producing a second conductivity type semiconductor layer on a portion of the first major surface of siad semiconductor substrate for receiving incident light and forming a pn junction with said substrate for generating a photovoltage in response to incident light;

depositing a first electrode on siad semiconductor layer;

forming a first recess in said semiconductor substrate where siad semiconductor layer is missing, the recess extendign in the direction between teh first and second major surfaces;

depositing an electrically conductingg materal in the first recess and on a part of the first major surface and where said semiconductor layer is absent, electrically insulated from siad semiconductor layer;

removing a portion of said semiconductor substrate at teh second major surface to expose the electrically conductive material; and depositing a second electrode onteh second major surface of said semiconductor substrate, electrically connected to said electrically conductive material.

7. A proudction method for a solar cell as defined in claim 6 including forming a plurality of the first recesses and severing siad substrate into a plurality of cells at the first recesses and at positoins spaced from the first recesses.

8. A productio method for a solar cell as defined in claim 6 including forming a pluarlity of the first recesses and a pluarlity of second recesses in sadi semiconductor substrate shallower than the first recesses, depostiing electricaly conductive material in the second recesses and severing the substraet into a plurlaity of cells at the first and second recesses.

* * * * *

UNITED STATES PATENT AND TRADEMARK OFFICE
CERTIFICATE OF CORRECTION

PATENT NO. : 5,017,243

DATED : May 21, 1991

INVENTOR(S) : Mutsuyuki Otsubo

It is certified that error appears in the above-identified patent and that said Letters Patent is hereby corrected as shown below:

Title Page:
In item [57] Abstract, line 7, change "f" to --of--.

Column 7, line 5, change "siad" to --said--;
    line 10, change "siad" to --said--;
    line 15, change "siad" to --said--;
    line 16, change "siad" to --said--;
    lines 19 and 20, change "siad" to --said--;
    line 19, change "electically" to --electrically--;
    line 29, change "plurliaty" to --plurality;
    line 30, change "serrially" to --serially--;
    lines 39-40, change "idsposed" to --disposed--;
    line 40, change "siad" to --said--;
    line 45, change "fisrt" to --first--;
        change "siad" to --said--;
    line 48, change "siad" to --said--;
    line 50, change "siad" to --said--;
    line 51, change "siad" to --said--;
    line 52, change "siad" to --said--.

Column 8, line 1, change "conducto" to --conductor--;
    line 2, change "adn" to --and--;
    line 6, change "siad" to --said--;
    line 7, change "siad" to --said--;
    line 12, change "adjacnet" to --adjacent--;

UNITED STATES PATENT AND TRADEMARK OFFICE
CERTIFICATE OF CORRECTION

PATENT NO. : 5,017,243

DATED : May 21, 1991

INVENTOR(S) : Mutsuyuki Otsubo

It is certified that error appears in the above-identified patent and that said Letters Patent is hereby corrected as shown below:

```
Column 8, line 13, change "comprsiing" to --comprising--;
          line 14, change "ocnductivyt" to --conductivity--;
          line 18, change "siad" to --said--;
          line 23, change "siad" to --said--;
          line 26, change "siad" to --said--;
          line 27, change "extendign" to --extending--;
                   change "teh" to --the--;
          line 29, change "conductingg" to --conducting--;
                   change "materal" to --material--;
          line 32, change "siad" to --said--;
          line 35, change "teh" to --the--;
          line 37, change "onteh" to --on the--;
          line 41, change "proudction" to --production--;
          line 43, change "siad" to --said--;
          line 44, change "positoins" to --positions--;
          line 46, change "productio" to --production--;
          line 47, change "plurlaity" to --plurality--;
          line 48, change "plurarlity" to --plurality--;
                   change "sadi" to --said--;
          line 49, change "depóstiing" to --depositing--;
          line 50, change "electricaly" to --electrically--;
          line 51, change "substraet" to --substrate--;
                   change "plurlaity" to --plurality--.
```

Signed and Sealed this

Sixth Day of October, 1992

Attest:

DOUGLAS B. COMER

Attesting Officer      Acting Commissioner of Patents and Trademarks